US012557254B2

(12) United States Patent
Nagappan et al.

(10) Patent No.: US 12,557,254 B2
(45) Date of Patent: Feb. 17, 2026

(54) TWO-PIECE RF SHIELD DESIGN

(71) Applicant: Applied Materials, Inc., Santa Clara, CA (US)

(72) Inventors: Vellaichamy Nagappan, Ramanathapuram (IN); Viren Kalsekar, Sunnyvale, CA (US); Vinay K. Prabhakar, Fremont, CA (US); Siva Chandrasekar, Hosur (IN); Satish Radhakrishnan, San Jose, CA (US); Rajath Kumar Lakkenahalli Hiriyannaiah, Bengaluru (IN); Dharma Ratnam Srichurnam, Hyderabad (IN); Sumit Subhash Singh, Mumbai (IN)

(73) Assignee: Applied Materials, Inc., Santa Clara, CA (US)

( * ) Notice: Subject to any disclaimer, the term of this patent is extended or adjusted under 35 U.S.C. 154(b) by 10 days.

(21) Appl. No.: 18/486,632

(22) Filed: Oct. 13, 2023

(65) Prior Publication Data
US 2025/0126765 A1    Apr. 17, 2025

(51) Int. Cl.
*H05K 9/00*     (2006.01)
*H01L 21/67*    (2006.01)

(52) U.S. Cl.
CPC ...... *H05K 9/0001* (2013.01); *H01L 21/67011* (2013.01)

(58) Field of Classification Search
CPC .................................................. H05K 9/0001
See application file for complete search history.

(56) References Cited

U.S. PATENT DOCUMENTS

2019/0244825 A1* 8/2019 Nagorny ........... H01J 37/32651
2021/0335581 A1* 10/2021 Babu ................. H01J 37/32642

FOREIGN PATENT DOCUMENTS

| JP | 2012512324 A   | 5/2012 |
| JP | 2023132649 A   | 9/2023 |
| KR | 20230025376 A  | 2/2023 |

OTHER PUBLICATIONS

PCT/US2024/050528, "International Search Report and Written Opinion", Jan. 24, 2025, 9 pages.

* cited by examiner

*Primary Examiner* — Hung V Ngo
(74) *Attorney, Agent, or Firm* — Kilpatrick Townsend & Stockton LLP

(57) ABSTRACT

Exemplary semiconductor processing chambers may include a chamber body. The chambers may include a substrate support assembly disposed within the chamber body. The chambers may include a substrate support assembly having a support plate seated atop a support stem. The chambers may include a radio frequency (RF) shield seated atop the chamber body and extending about a peripheral edge of the support plate. The RF shield may include a lower annular member. The RF shield may include an upper annular member seated atop the lower annular member. The upper annular member may define a lip that protrudes radially outward from an outer surface of the upper annular member. Each of the lower annular member and the upper annular member may include a dielectric material.

9 Claims, 9 Drawing Sheets

TWO-PIECE RF SHIELD DESIGN

TECHNICAL FIELD

The present technology relates to components and apparatuses for semiconductor manufacturing. More specifically, the present technology relates to processing chamber components and other semiconductor processing equipment.

BACKGROUND OF THE INVENTION

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Processing systems may use one or more components to distribute precursors or fluids into a processing region, which may improve uniformity of distribution. One or more of these components may be heated during processing operations. The heat may extend through components of the lid stack. Depending on the coupling of components within the system, the heat transfer may not be uniform between components. In some instances, the heat transfer may result in thermal gradients that may damage chamber components.

Thus, there is a need for improved systems and components that can be used to produce high quality semiconductor devices. These and other needs are addressed by the present technology.

BRIEF SUMMARY OF THE INVENTION

Exemplary semiconductor processing chambers may include a chamber body. The chambers may include a substrate support assembly disposed within the chamber body. The chambers may include a substrate support assembly having a support plate seated atop a support stem. The chambers may include a radio frequency (RF) shield seated atop the chamber body and extending about a peripheral edge of the support plate. The RF shield may include a lower annular member. The RF shield may include an upper annular member seated atop the lower annular member. The upper annular member may define a lip that protrudes radially outward from an outer surface of the upper annular member. Each of the lower annular member and the upper annular member may include a dielectric material.

In some embodiments, the chambers may include a pumping plate seated atop the chamber body. An inner surface of the pumping plate may define a ledge on which the lip of the upper annular member is seated. The chambers may include a thermal choke plate disposed between the chamber body and the pumping plate. The lower annular member may be seated atop the thermal choke plate. The pumping plate and the thermal choke plate may be coupled via one or more fasteners. Each of the one or more fasteners may include a head having a bottom surface that is spaced apart from a top surface of the pumping plate such that an air gap is provided between the bottom surface of the head and the top surface of the pumping plate. Each of the one or more fasteners may be disposed within a respective aperture formed through a thickness of the pumping plate. Each respective aperture may include an elongate cross-sectional shape. An inner edge of the thermal choke plate may define an annular protrusion that extends upward from a top surface of the thermal choke plate. The lower annular member may be seated atop the annular protrusion. A portion of a bottom surface of the lower annular member that is radially outward of the annular protrusion may be spaced apart from the top surface of the thermal choke plate by an air gap. The lower annular member may include an annular protrusion extending upward from an inner edge of an upper surface of the lower annular member. A portion of a bottom surface of the upper annular member that is radially outward from the annular protrusion may be spaced apart from an upper surface of the lower annular member by an air gap. The lower annular member may include a generally L-shaped cross-section. A bottom surface of the upper annular member may include a downward extending protrusion that is positioned above a ledge defined by a lower portion of the lower annular member.

Some embodiments of the present technology may encompass radio frequency shields. The shields may include a lower annular member. The shields may include an upper annular member seated atop the lower annular member. The upper annular member may define a lip that protrudes radially outward from an outer surface of the upper annular member. A top surface of the upper annular member may be sloped downward from an inner diameter to an outer diameter. Each of the lower annular member and the upper annular member may include a dielectric material.

In some embodiments, the lower annular member may include a generally L-shaped cross-section. A bottom surface of the upper annular member may include a downward extending protrusion that is positioned above a ledge defined by a lower portion of the lower annular member. A top outer edge of the lower annular member may be chamfered. The lower annular member may include an annular protrusion extending upward from an inner edge of an upper surface of the lower annular member. A portion of a bottom surface of the upper annular member that is radially outward from the annular protrusion may be spaced apart from an upper surface of the lower annular member by an air gap. A maximum thickness of the lower annular member may be between 5 mm and 20 mm. The lower annular member may include a lower portion and an upper portion that protrudes upward from the lower portion. The upper portion may be disposed at an inner diameter of the lower annular member. The upper portion may be disposed at an outer diameter of the lower annular member.

Some embodiments of the present technology may encompass semiconductor processing chambers that include a chamber body. The chambers may include a substrate support assembly disposed within the chamber body. The substrate support assembly may include a support plate seated atop a support stem. The chambers may include a lid plate seated atop the chamber body. The chambers may include a thermal choke plate seated atop the lid plate. The chambers may include a pumping plate seated atop the thermal choke plate. The chambers may include a radio frequency (RF) shield seated atop the thermal choke plate and the pumping plate. The RF shield may extend about a peripheral edge of the support plate. The RF shield may include a lower annular member. The RF shield may include an upper annular member seated atop the lower annular member. The upper annular member may define a lip that protrudes radially outward from an outer surface of the upper annular member. Each of the lower annular member and the upper annular member may include a dielectric material.

Such technology may provide numerous benefits over conventional systems and techniques. For example, embodiments may improve the ability of one or more components to withstand the thermal gradients experienced during processing operations, and in particular high temperature processing operations. Additionally, embodiments may provide component coupling mechanisms that do not warp components during thermal expansion. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
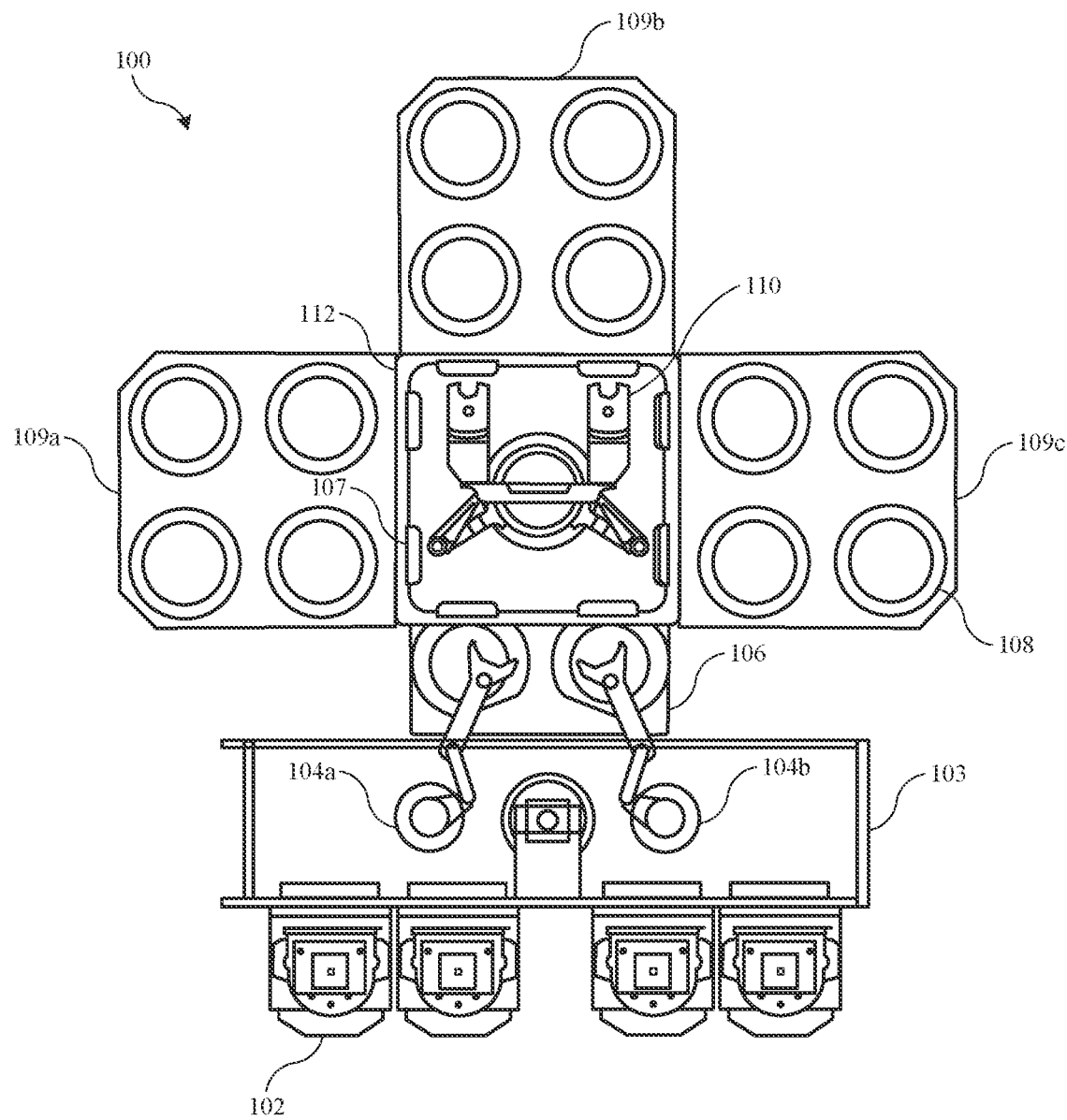
FIG. 1A shows a schematic top view of an exemplary processing tool according to some embodiments of the present technology.

Several of the figures are included as schematics. It is to be understood that the figures are for illustrative purposes and are not to be considered of scale or proportion unless specifically stated to be of scale or proportion. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Substrate processing operations often use radio frequency (RF) current to generate a plasma within or proximate a processing region to enable films of dielectric materials to be deposited or etched on a semiconductor substrate. Many semiconductor processing chambers utilize RF shields to constrain the RF field within the chamber. However, during high temperature processing operations, conventional single piece RF shields may experience a large thermal gradient across the height and/or width of the RF shield. This thermal gradient may lead to stress that causes cracking and/or other damage of the RF shield (particularly at thin/small load-bearing points) during high temperature operations. Additionally, conventional pumping plates for evacuating plasma radicals and gases from the chamber may be bolted to a pumping plate or other component. When the pumping plate is bolted down, thermal expansion of the pumping plate may result in warpage of the pumping plate and increase spot contact between the pumping plate and adjacent chamber components.

The present technology overcomes these challenges by utilizing a two-piece RF shield. The use of a two-piece RF shield results in each piece of the RF shield being smaller, which reduces the thermal gradient across each component. The reduction in thermal gradient may reduce the stress within the piece and reduce the likelihood of the piece cracking or otherwise being damaged. Embodiments may also eliminate the use of a pretensioned bolted connection between the pumping plate and lower lid to reduce warping of the pumping plate during high temperature operations. For example, a head of the bolt (or other fastener) may be maintained a distance above a top surface of the pumping plate to create an air gap between the bolthead and the pumping plate to accommodate thermal expansion of the pumping plate. The disclosure will discuss one possible system and chamber that may include pedestals according to embodiments of the present technology before additional variations and adjustments to this system according to embodiments of the present technology are described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109*a-c*, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109*a* and 109*b*, may be used to deposit material on the substrate, and the third set of processing chambers, such as the processing chambers or regions in quad section 109*c*, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
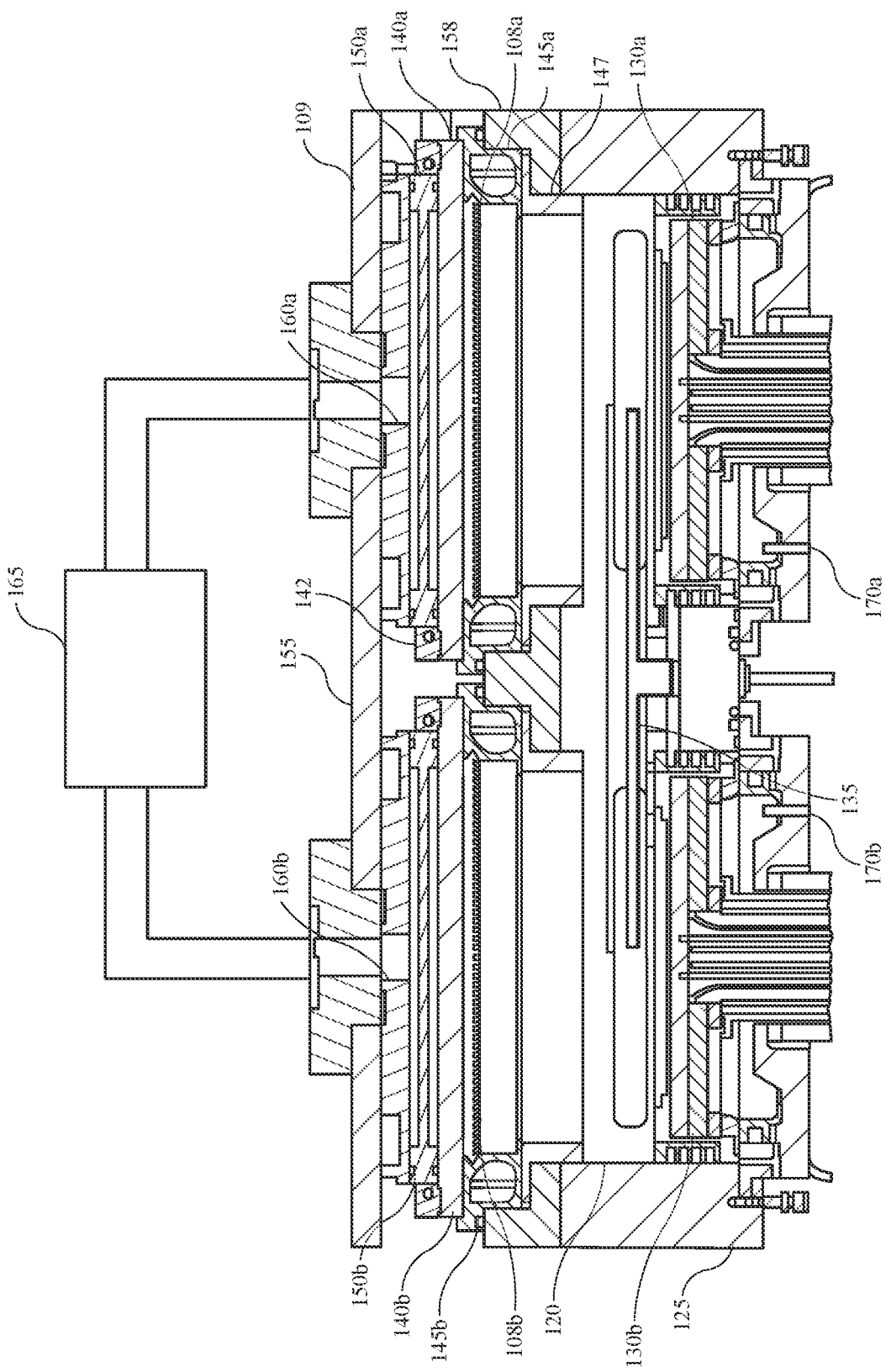
FIG. 1B shows a schematic partial cross-sectional view of an exemplary processing system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130*a* may deliver a substrate into processing region 108*a*, while substrate support 130*b* may deliver a substrate into processing region 108*b*. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140a may be included to define from above processing region 108a, and faceplate 140b may be included to define from above processing region 108b. In some embodiments the substrate support may operate as the companion electrode for generating a capacitively-coupled plasma between the faceplate and the substrate support. The faceplate may be heated in some embodiments with a heater 142 extending about the faceplate. A pumping liner 145 may at least partially define the processing region 108 radially, or laterally depending on the volume geometry. Again, separate pumping liners may be utilized for each processing region. For example, pumping liner 145a may at least partially radially define processing region 108a, and pumping liner 145b may at least partially radially define processing region 108b. The pumping liners 145 may be seated on a choke plate 147, which may control heat distribution from the lid stack to the cooled chamber body. A blocker plate 150 may be positioned between a lid 155 and the faceplate 140 in embodiments, and again separate blocker plates may be included to facilitate fluid distribution within each processing region. For example, blocker plate 150a may be included for distribution towards processing region 108a, and blocker plate 150b may be included for distribution towards processing region 108b.

Lid 155 may be a separate component for each processing region or may include one or more common aspects. Lid 155 may be one of two separate lid plates of the system in some embodiments. For example, a first lid plate 158 may be seated over transfer region housing 125. The transfer region housing may define an open volume, and first lid plate 158 may include a number of apertures through the lid plate separating the overlying volume into specific processing regions. In some embodiments, such as illustrated, lid 155 may be a second lid plate, and may be a single component defining multiple apertures 160 for fluid delivery to individual processing regions. For example, lid 155 may define a first aperture 160a for fluid delivery to processing region 108a, and lid 155 may define a second aperture 160b for fluid delivery to processing region 108b. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

In some embodiments a purge channel 170 may extend through the transfer region housing proximate or near each substrate support 130. For example, a plurality of purge channels may extend through the transfer region housing to provide fluid access for a fluidly coupled purge gas to be delivered into the transfer region. The number of purge channels may be the same or different, including more or less, than the number of substrate supports within the processing system. For example, a purge channel 170 may extend through the transfer region housing beneath each substrate support. With the two substrate supports 130 illustrated, a first purge channel 170a may extend through the housing proximate substrate support 130a, and a second purge channel 170b may extend through the housing proximate substrate support 130b. It is to be understood that any additional substrate supports may similarly have a plumbed purge channel extending through the transfer region housing to provide a purge gas into the transfer region.

When purge gas is delivered through one or more of the purge channels, it may be similarly exhausted through pumping liners 145, which may provide all exhaust paths from the processing system. Consequently, in some embodiments both the processing precursors and the purge gases may be exhausted through the pumping liners. The purge gases may flow upwards to an associated pumping liner, for example purge gas flowed through purge channel 170b may be exhausted from the processing system from pumping liner 145b.

Figure 2:
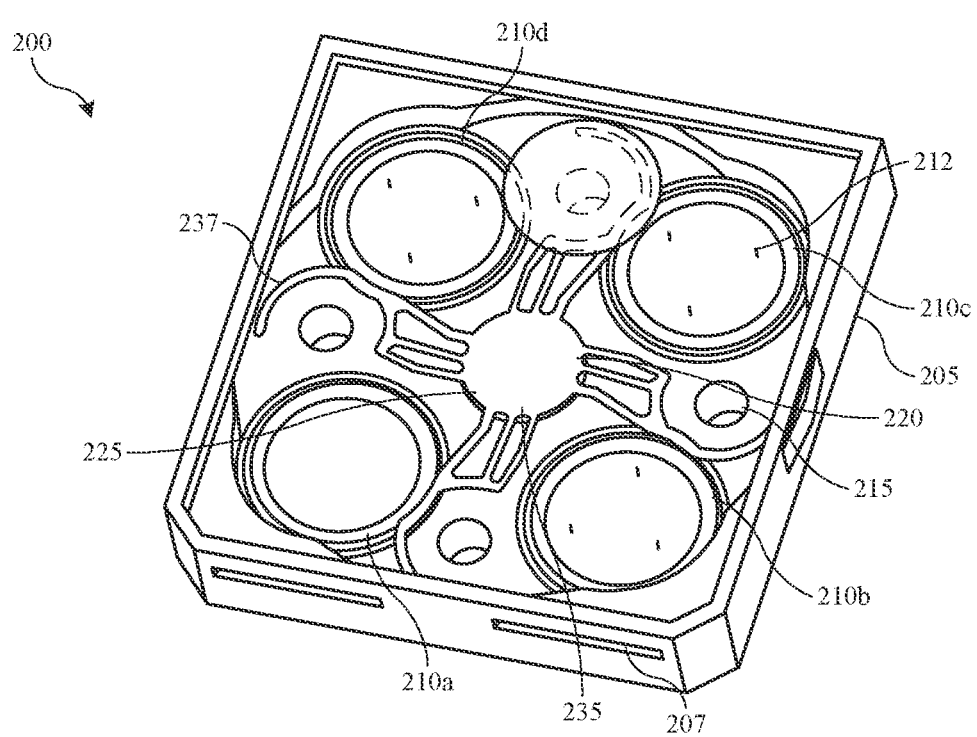
FIG. 2 shows a schematic isometric view of a transfer section of an exemplary substrate processing system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region 120 described above and may include any of the components or characteristics described. The system illustrated may include a transfer region housing 205 defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210 and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors and may be monolithically formed with the end effectors. Any number of other materials may be utilized that may facilitate operation or resistance during operation and are similarly encompassed by the present technology.

Figure 3:
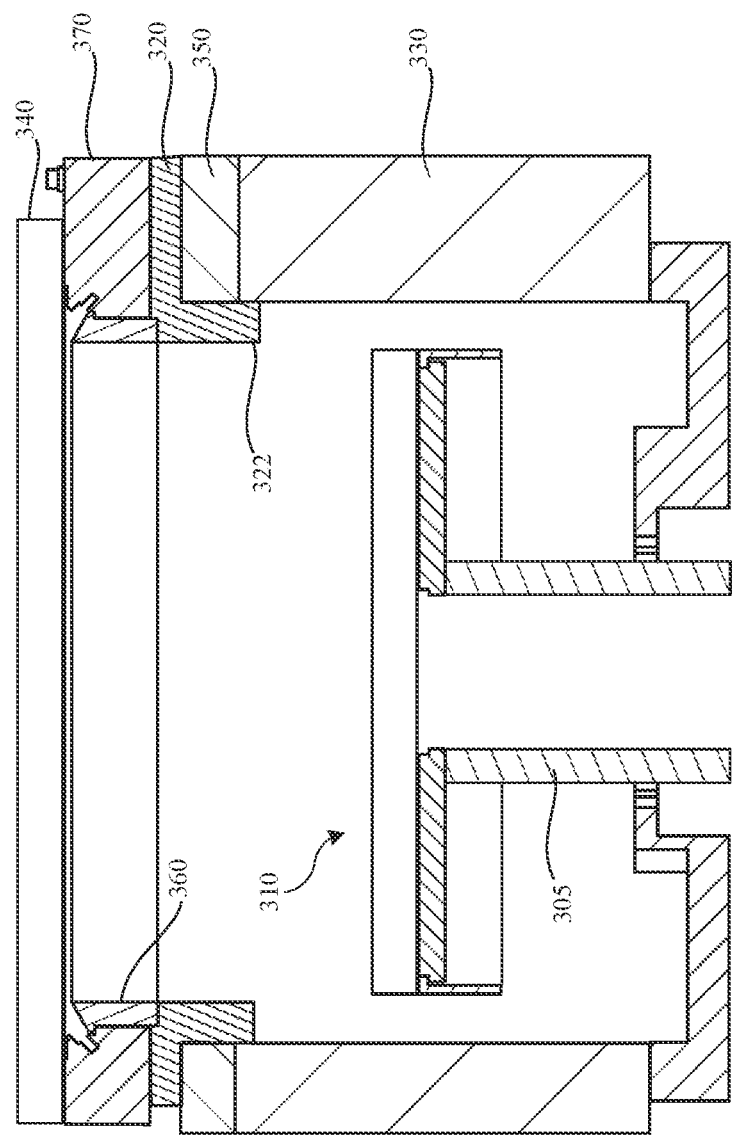
FIG. 3 shows a schematic partial cross-sectional view of an exemplary processing system according to some embodiments of the present technology.

FIG. 3 shows a cross-sectional view of an exemplary substrate processing system 300 according to some embodiments of the present technology. FIG. 3 may illustrate further details relating to components in system 100, such as for pumping liners 145 and choke plate 147. System 300 is understood to include any feature or aspect of system 100 discussed previously in some embodiments. The system 300 may be used to perform semiconductor processing operations including deposition of hardmask materials as previously described, as well as other deposition, removal, and cleaning operations. In particular, the substrate processing system 300 may include a transfer region housing (or chamber body) 330, pedestal 310, choke plate 320, lower lid plate 350, RF shield 360, faceplate 340, and/or pumping liner or pumping plate 370 (among other components). The chamber body 330 may at least partially define a transfer region and a processing region.

Pedestal or substrate support 310 may be disposed within the interior of the chamber body 330. The substrate support 310 may be vertically translatable within the chamber body 330 between the transfer region and the processing region. The substrate support 310 may include a support plate, which may include a heater, an isolator, and/or a ground plate in some embodiments. The substrate support 310 may also include a support stem 305 that may extend through a bottom of the chamber body 330. The substrate support 310 is translatable within the chamber body 330 between a lower transfer region (illustrated here) and an upper processing region. During a processing operation, the substrate support 310 is moved upward within the chamber body 330 into a process position within the processing region. Once deposition and/or other processing operations are complete, the substrate support 310 may be lowered to a transfer position.

The processed substrate may be removed from the substrate support 310 and a new substrate may be positioned atop the substrate support 310.

The lower lid plate 350 may be seated atop the chamber body 330 (either directly or indirectly). The choke plate 320 may be seated on an upper surface of the lower lid plate 350 in some embodiments. As discussed above for choke plate 147, the choke plate 320 may be used to control heat distribution to a chamber in the substrate processing system (e.g., the chamber body 330). The choke plate 320 be or include a thermally conductive plate that may be seated on the lower lid plate 350 on a first surface of the choke plate 320. The choke plate 320 may define a first aperture axially aligned the processing chamber and pedestal 310. The choke plate 320 may also define a second aperture axially aligned with an exhaust lumen formed in the chamber body 330 and/or pumping plate 370 that may form a portion of an exhaust channel to evacuate gases from the processing region. As illustrated, choke plate 320 may include a rim 322 defining the first aperture through the choke plate 320. The rim 322 may extend along a sidewall of the lower lid plate 350. In some embodiments a gap may be maintained between the rim 322 and a portion of the lower lid plate 350 to control heat flow between the components. Rim 322 may extend vertically from the first surface of the choke plate 320 in a direction towards the lower lid plate 350 and may form a protrusion from the choke plate 320. The choke plate 320 may also include a body that extends laterally outward from the rim 322. For example, the body may extend outward from an outer surface of the rim 322 and may be seated atop the lower lid plate 350 in some embodiments. In a particular embodiment, the body and the rim 322 may share a single first surface such that the body is positioned at a top end of the choke plate 320, although other positions of the body relative to the rim 322 are possible.

The RF shield 360 and pumping plate 370 may be seated atop the choke plate 320, such as atop the first surface of the choke plate 320. The RF shield 360 may be positioned to surround the support plate of the substrate support 310 when the substrate support is in the processing position. The RF shield 360 may be formed from an insulating material, such as a ceramic and/or other dielectric material that may help constrain the RF field within the processing region. The RF shield 360 may have an angled or sloped top edge that slopes downward to a top edge of the pumping plate 370 to create a vertical gap between the RF shield 360 and the pumping plate 370 that enables one or more gases and/or plasmas to be exhausted from the processing region via one or more outlets that are defined in a surface of the pumping plate 370. For example, the pumping plate 370 may define a number of apertures at regular and/or irregular angular intervals about a portion of an inner surface (e.g., an upper inner corner of the pumping plate 370) that enable process gases and plasmas to be drawn into an annular pumping plenum defined at least partially by the pumping plate 370. Gases exhausted via the pumping plate 370 may be passed from the pumping plenum through apertures defined by the choke plate 320 and chamber body 330 that are radially outward of the processing region to a foreline and/or other exhaust system.

An inner surface of the RF shield 360 and an inner surface of the choke plate 320 may be aligned flush with each other such that the inner surfaces define a substantially uniform diffusion surface. For example, the inner surfaces may have substantially the same circumference and be concentric with each other to define the smooth surface. This smooth surface allows for purge gas to flow along the surface without running into interference, thus allowing for a more uniform and consistent diffusion of purge gas toward the faceplate 340. This increased uniformity and consistency, in turn, allows for a decreased flow rate for the purge gas to purge the processing region and prevent sublimation.

Figure 4:
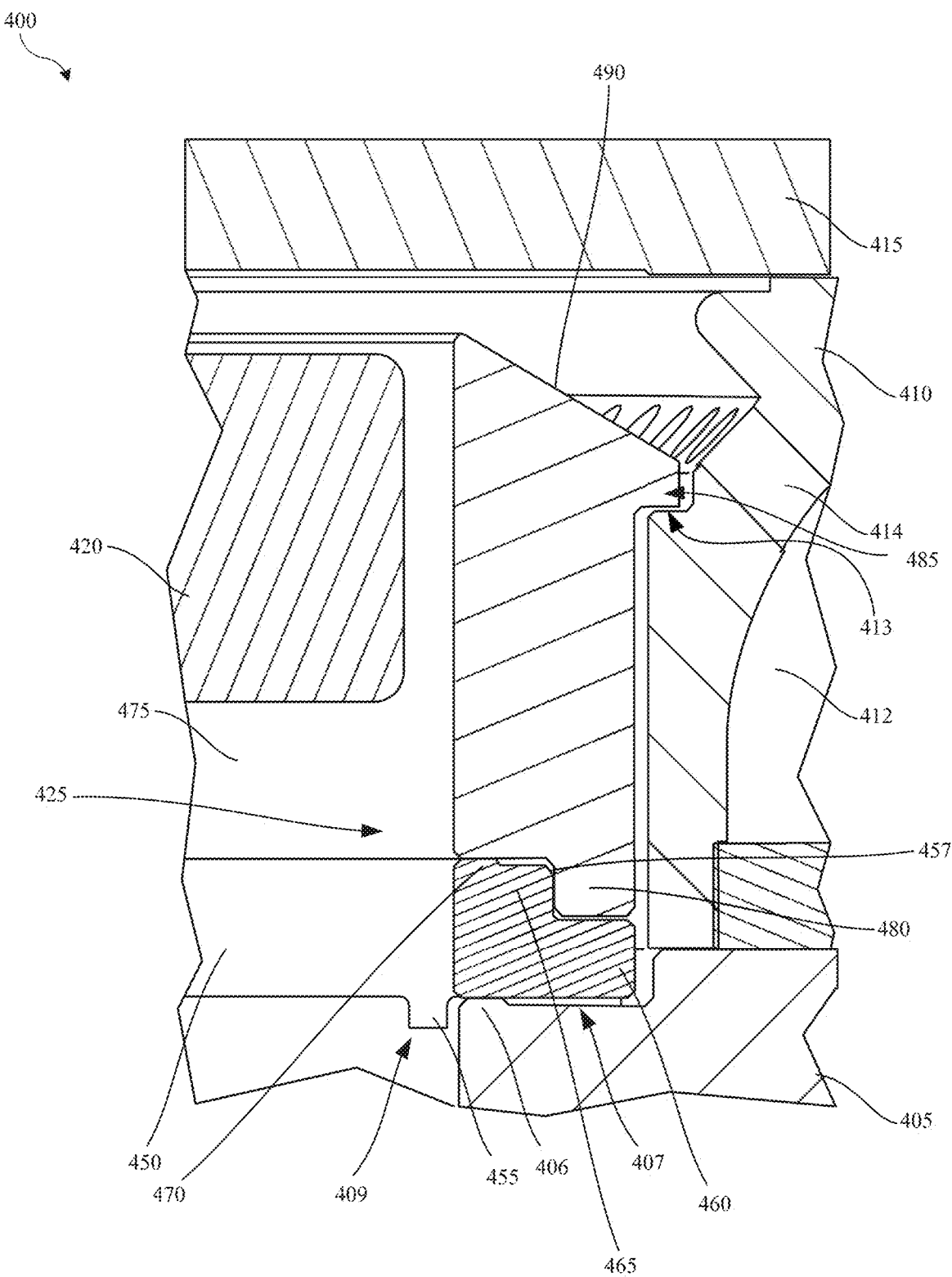
FIG. 4 shows a schematic partial cross-sectional view of an exemplary processing system according to some embodiments of the present technology.

FIG. 4 shows a partial cross-sectional view of an exemplary substrate processing system 400 according to some embodiments of the present technology. FIG. 4 may illustrate further details relating to components in system 100 and/or system 300, such as for pumping liners 145, RF shield 360, pumping plate 370, choke plate 147, and choke plate 320. System 400 is understood to include any feature or aspect of system 100 or system 300 discussed previously in some embodiments. The system 400 may be used to perform semiconductor processing operations including deposition of hardmask materials as previously described, as well as other deposition, removal, and cleaning operations.

System 400 may include a choke plate 405, which may be similar to choke plate choke plate 147 and/or choke plate 320. Choke plate 405 may be seated atop a chamber body (such as chamber body 330) and/or a lid plate (such as lower lid plate 350) and may help thermally isolate the chamber body and/or the lid plate from higher temperatures experienced by components that are above the choke plate 405. In some embodiments, an inner portion of a top surface of choke plate 405 may define a ledge 407 that is recessed relative to a main surface of the choke plate 405. Ledge 407 may extend 360 degrees about the choke plate 405. In some embodiments, ledge 407 may define one or more depressions 409, which may be spaced apart from one another about the circumference of the ledge 407. Depressions 409 may be used as alignment features in some embodiments. In some embodiments, an inner edge of the choke plate 405 may define an annular protrusion 406 that extends upward from a top surface of the choke plate 405. For example, the annular protrusion 406 may extend upward from an upward facing surface of the ledge 407. The annular protrusion 406 may extend only partially from an inner diameter of the choke plate 405 toward a vertical wall defining an outer boundary of the ledge 407, such that an outer portion of the ledge 407 is recessed relative to the annular protrusion 406. For example a width of the annular protrusion 406 may between or about 1 mm and 5 mm, between or about 2 mm and 4 mm, between or about 2.5 mm and 3.5 mm, or between or about 2.75 mm and 3.25 mm. In some embodiments, the annular protrusion 406 may have a height (e.g., relative to a main or lower surface of the ledge 407) of between or about 0.1 mm and 1 mm, between or about 0.25 mm and 0.75 mm, or between or about 0.4 mm and 0.6 mm.

System 400 may include a pumping plate 410 that may be seated atop the choke plate 405 in some embodiments. The pumping plate 410 may define a pumping plenum 412 that extends an annulus of the pumping plate 410. The pumping plenum 412 may be fluidly coupled with one or more exhaust ports that extend through the choke plate 405, the lid plate, and/or the chamber body and that fluidly couple the pumping plenum 412 with an exhaust system. Pumping plate 410 may define a number of pumping ports 414 or other apertures that extend through an outer wall of the pumping plate 410 and that fluidly couple the interior of a chamber body (e.g., a processing region) with the pumping plenum 412. The pumping ports 414 may be distributed about the annulus of the pumping plate 410 at regular or irregular intervals. As illustrated, the pumping ports 414 extend through an upper inner corner of the pumping plate 410, with the pumping ports 414 being angled relative to horizontal. In some embodiments, an inner surface of the pumping plate 410 may define a ledge 413 that may extend about the annulus of the pumping plate 410. The ledge 413 may be recessed relative to a bottom edge of the pumping ports 414 in some embodiments.

A faceplate 415 may be seated atop the pumping plate 410. The faceplate 415 may define a number of apertures (not shown) therethrough to deliver one or more gases and/or plasmas to the processing region of the system 400. System 400 may also include a substrate support assembly 420, which may include a plate that may support a substrate during processing operations. System 400 may include an RF shield 425 that is seated atop the chamber body. For example, in the illustrated embodiment, the RF shield 425 is seated atop the choke plate 405 and the pumping plate 410. RF shield 425 may be used as RF shield 360 and may include any of the features described in relation to RF shield 360. The RF shield 425 may be annular in shape with an inner diameter of the RF shield 425 defining at least a portion of the lateral boundary of the processing region. In some embodiments, the RF shield 425 may extend about a peripheral edge of a support plate of the substrate support assembly 420. The RF shield 425 may be formed from an electrically insulating material, such as a ceramic and/or other dielectric material, which may enable the RF shield 425 to constrain the RF field generated within the processing region (such as via RF current that is supplied to the faceplate 415 and/or substrate support assembly 420). For example, in a particular embodiment the RF shield 425 may be formed from and/or otherwise include aluminum oxide, although other materials may be used in various embodiments.

Figure 4A:
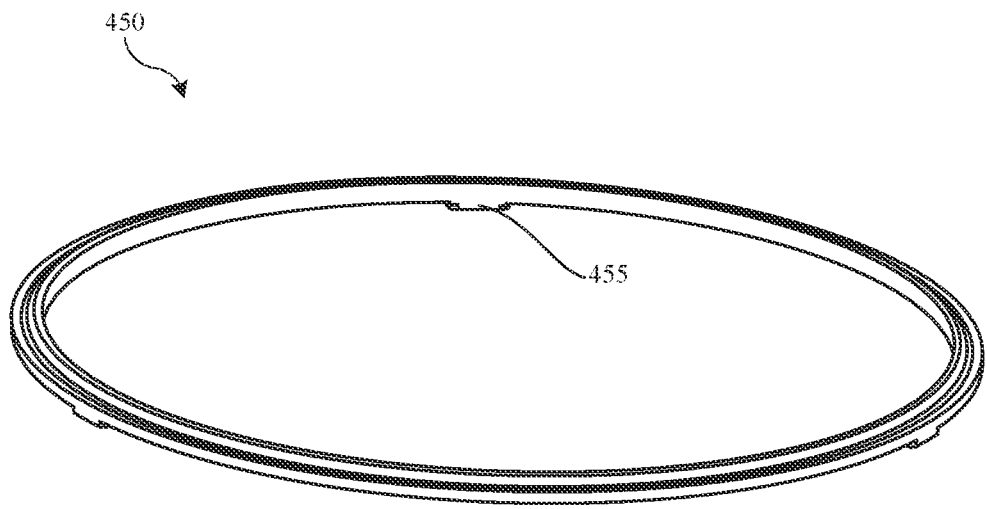
FIG. 4A shows an isometric view of a lower annular member of an exemplary RF shield according to some embodiments of the present technology.
Figure 4B:
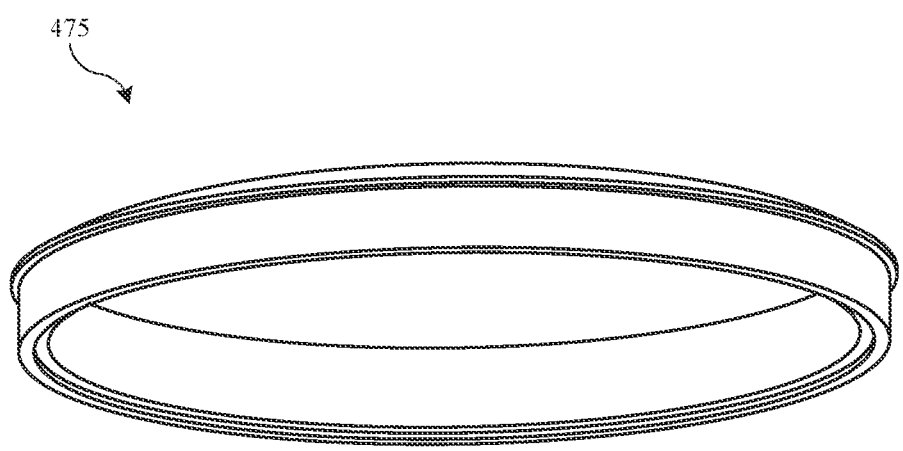
FIG. 4B shows an isometric view of an upper annular member of an exemplary RF shield according to some embodiments of the present technology.

The RF shield 425 may be formed from multiple pieces in some embodiments. For example, in the illustrated embodiment the RF shield 425 includes a lower annular member 450 (shown in FIGS. 4 and 4A) and an upper annular member 475 (shown in FIGS. 4 and 4B). The lower annular member 450 may be seated atop the choke plate 405. For example, the lower annular member 450 may be seated atop the ledge 407, with the bottom surface of the lower annular member 450 being supported atop the annular protrusion 406. In such embodiments, a portion of the bottom surface of the lower annular member 450 that is radially outward of the annular protrusion 406 may be spaced apart from the top surface of the choke plate 405 by an air gap matching a height of the annular protrusion 406. In some embodiments, an annular protrusion may be provided on an inner portion of the bottom surface of the lower annular member 450, which may then be seated on the ledge 407 (with or without the annular protrusion 406). The presence of an annular protrusion (e.g., annular protrusion 406) may minimize the contact area between the choke plate 405 and the lower annular member 450, which may reduce thermal transfer between the two components. Additionally, by positioning the annular protrusion 406 (or other annular protrusion) on an inner portion (e.g., extending from an inner diameter) of the choke plate 405, the contact interface may prevent process gases and/or plasma radicals from reaching the air gap formed between the lower annular member 450 and the choke plate 405. In some embodiments, the bottom surface of the lower annular member 450 may include a number of protrusions 455, which may correspond with a size and number of the depressions 409 of the choke plate 405. Each protrusion 455 may be inserted within one of the depressions 409 to help maintain the lower annular member 450 in a predetermined alignment with the choke plate 405. As best seen in FIG. 4A, lower annular member 450 may include three protrusions 455, however other numbers of protrusions may be provided in various embodiments. For example, the lower annular member 450 may include at least one protrusion, at least two protrusions, at least three protrusions, at least four protrusions, at least five protrusions, or more.

In some embodiments, the lower annular member 450 may have a generally L-shaped cross-section. For example, the lower annular member 450 may have a lower portion 460 and an upper portion 465 that protrudes upward from the lower portion 460. For example, the lower portion 460 may form a base of an L-shape and may extend radially outward of the upper portion 465 such that the upper portion 465 protrudes from only an inner diameter or inner portion (e.g., inner 75%, inner 60%, inner 50%, or less) of the lower portion 460. In some embodiments, some or all of the edges, and in particular a top outer edge 457 (e.g., outer edge of the upper portion 465) of the lower annular member 450 may be chamfered and/or otherwise dulled. A maximum of height of lower annular member 450 (e.g., from a bottom surface of the lower portion 460 to an upper surface of the upper portion 465) may be between or about 5 mm and 20 mm, between or about 7.5 mm and 15 mm, or between about 8.5 mm and 12 mm, although other heights are possible in various embodiments. A minimum height of lower annular member 450 (e.g., from a bottom surface of the lower portion 460 to an upper surface of the lower portion 460) may be between or about 3 mm and 10 mm, between or about 4 mm and 8 mm, or between about 5 mm and 7 mm, although other heights are possible in various embodiments.

In some embodiments, the lower annular member 450 may define an annular protrusion 470 extending upward from an inner edge of an upper surface of the lower annular member 450. The annular protrusion 470 may extend only partially from an inner diameter of the lower annular member 450 toward an outer edge of the lower annular member 450. For example, the annular protrusion 470 may extend along a portion of the width of the upper portion 465 such that an outer region of the upper portion 465 is recessed relative to the annular protrusion 470. For example, a width of the annular protrusion 470 may between or about 1 mm and 5 mm, between or about 2 mm and 4 mm, between or about 2.5 mm and 3.5 mm, or between or about 2.75 mm and 3.25 mm. In some embodiments, the annular protrusion 470 may have a height (e.g., relative to a main surface of the ledge 407) of between or about 0.1 mm and 1 mm, between or about 0.25 mm and 0.75 mm, or between or about 0.4 mm and 0.6 mm.

The upper annular member 475 may be seated atop the lower annular member 450. For example, a bottom surface of the upper annular member 475 may be seated atop the annular protrusion 470 such that a portion of a bottom surface of the upper annular member 475 that is radially outward from the annular protrusion 470 is spaced apart from an upper surface of the lower annular member 450 by an air gap of a size matching a height of the annular protrusion 470. In some embodiments, a bottom surface of the upper annular member 475 may include a downward extending protrusion 480 that is positioned above a ledge defined by the lower portion 460 of the lower annular member 450. The protrusion 480 may be sized and shaped to fill substantially all of the space above the lower portion 460 of the lower annular member 450 that is not occupied by the upper portion 465. With the exception of the portion that contacts the annular protrusion 470, the entirety of the bottom surface of the upper annular member 475 (including the protrusion 480) may be spaced apart from the lower annular member 450 by an air gap. For example, the horizontal faces of the bottom surface of the upper annular member 475 may be spaced apart from the horizontal faces of the lower annular member 450 by a distance of between or about 0.1 mm and 1 mm, between or about 0.25 mm and 0.75 mm, or between or about 0.4 mm and 0.6 mm. Vertical faces of the bottom surface of the upper annular member 475 may be spaced apart from the vertical faces of the lower annular member 450 by a distance of between or about 0.05 mm and 0.5 mm, between or about 0.1 mm and 0.4 mm, or between or about 0.15 mm and 0.3 mm. The presence of an air gap may help reduce a contact area between the lower annular member 450 and the upper annular member 475 to reduce thermal transfer between the components. Additionally, the air gap may help provide room to accommodate thermal expansion of one or both components.

The upper annular member 475 may define a lip 485 that protrudes radially outward from an outer lateral surface (e.g., outer diameter) of the upper annular member 475. For example, the lip 485 may be disposed at a top end of the outer lateral surface of the upper annular member 475. The lip 485 may be sized to be seated atop the ledge 413 of the pumping plate 410. In some embodiments, a bottom surface of the lip 485 and/or the outer lateral surface of the upper annular member 475 and/or lower annular member 450 may be spaced apart from the pumping plate 410 to reduce thermal transfer between the components to accommodate thermal expansion of one or both components. The air gap may be between or about 0.05 mm and 0.5 mm, between or about 0.1 mm and 0.4 mm, or between or about 0.2 mm and 0.35 mm.

In some embodiments, a top surface 490 of the upper annular member 475 may be sloped downward from an inner diameter to an outer diameter such that the inner edge of the upper annular member 475 is higher than the outer edge of the upper annular member 475. In some embodiments, the sloped upper surface 490 may extend to the lip 485 such that the upper surface of the lip 485 is sloped. The slope may be at a constant angle such that upper surface 490 tapers linearly. In other embodiments, a variable, curved slope may be provided on the upper surface 490. The slope of the upper surface 490 may define a bottom boundary of an exhaust path that directs exhausted gas and plasma into the pumping ports 414 of the pumping plate 410.

By using a two-piece RF shield 425, each piece (e.g., lower annular member 450 and upper annular member 475) may be smaller, which may reduce the magnitude of the thermal gradient exhibited across the lateral and/or vertical dimensions of the RF shield 425. The reduced thermal gradient may reduce the internal stresses experienced by each piece of the RF shield 425 and may help reduce the likelihood of cracking or other damage to the RF shield. The reduction of the thermal gradient may be particularly beneficial during high temperature processing operations.

Figure 5A:
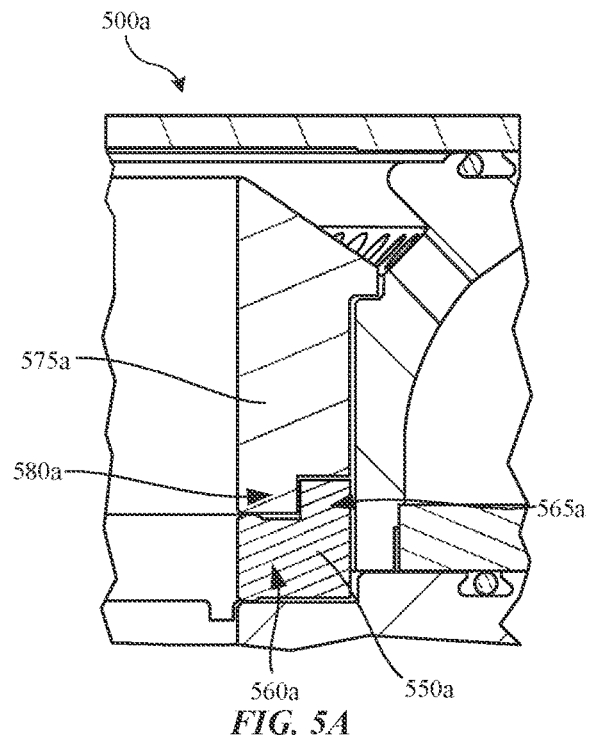
FIG. 5A shows a schematic cross-sectional view of an exemplary RF shield according to some embodiments of the present technology.

FIGS. 5A-5F illustrate alternate embodiments of two-piece RF shields 500 in accordance with the present invention. Each RF shield 500 may be similar to RF shield 360 and RF shield 425 and may include any of the features described in relation to RF shield 360 and RF shield 425. FIG. 5A illustrates RF shield 500a that includes a lower annular member 550a and an upper annular member 575a that is seated atop lower annular member 550a. As illustrated, lower annular member 550a may have a generally L-shaped cross-section. For example, the lower annular member 550a may have a lower portion 560a and an upper portion 565a that protrudes upward from the lower portion 560a. For example, the lower portion 560a may form a base of an L-shape and may extend radially inward of the upper portion 565a such that the upper portion 565a protrudes from only an outer diameter or outer portion (e.g., inner 75%, inner 60%, inner 50%, or less) of the lower portion 560a. A bottom surface of the upper annular member 575a may include a downward extending protrusion 580a that is positioned above a ledge defined by the lower portion 560a of the lower annular member 550a. The protrusion 580a may be sized and shaped to fill substantially all of the space above the lower portion 560a of the lower annular member 550a that is not occupied by the upper portion 565a. As described above, one or more annular protrusions may be provided on the lower annular member 550a and/or the upper annular member 575a to reduce a contact area between the components and to generate an air gap.

Figure 5B:
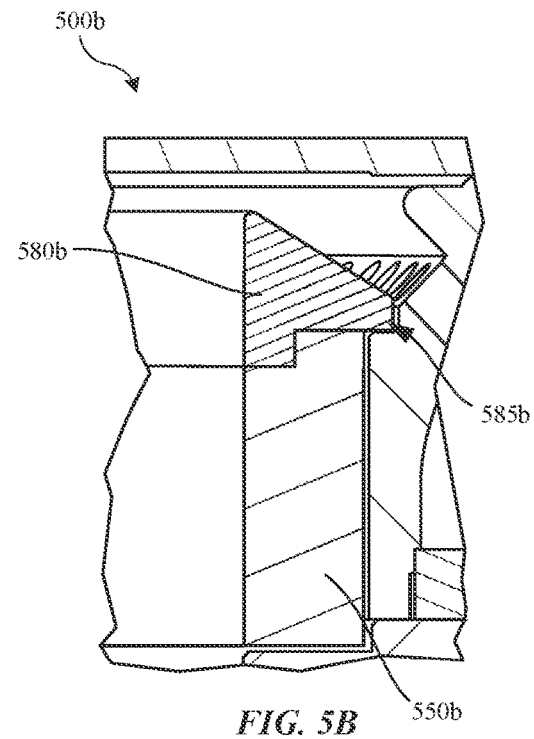
FIG. 5B shows a schematic cross-sectional view of an exemplary RF shield according to some embodiments of the present technology.
Figure 5C:
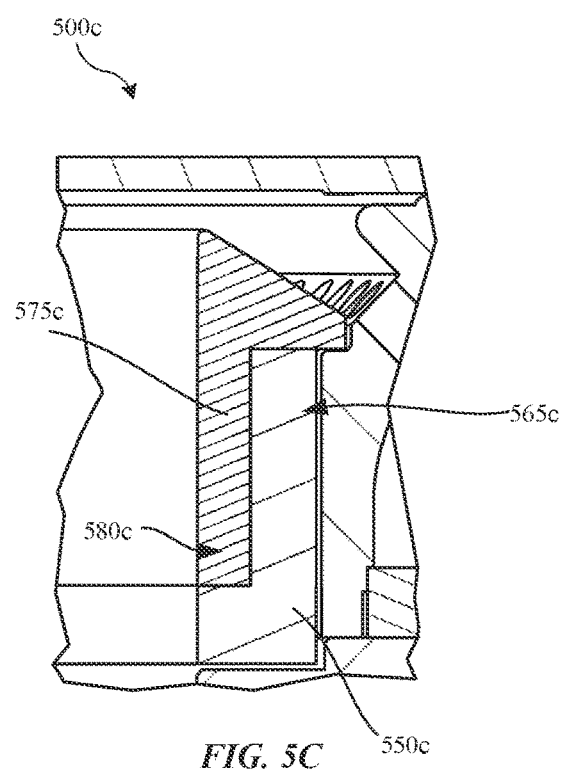
FIG. 5C shows a schematic cross-sectional view of an exemplary RF shield according to some embodiments of the present technology.
Figure 5D:
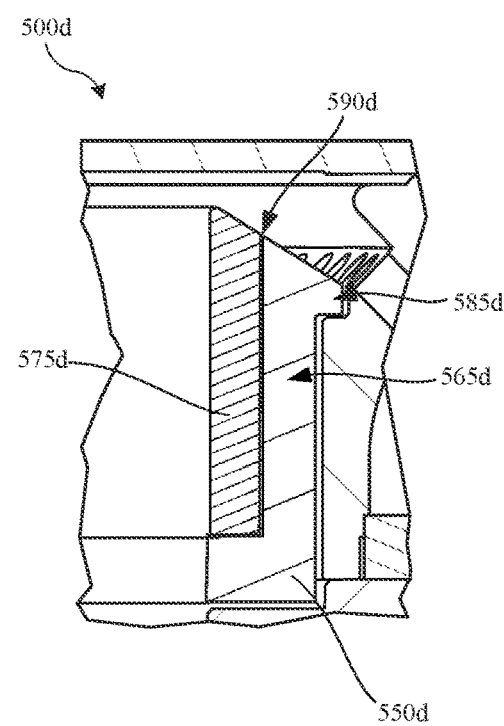
FIG. 5D shows a schematic cross-sectional view of an exemplary RF shield according to some embodiments of the present technology.

FIG. 5B illustrates RF shield 500b that includes a lower annular member 550b and an upper annular member 575b that is seated atop lower annular member 550b. RF shield 500b may be similar to RF shield 500a, but lower annular member 550b may be taller than the upper annular member 575b. For example, the lower annular member 550b may form at least 50% of a height of the RF shield 500b, at least 60% of a height of the RF shield 500b, at least 70% of a height of the RF shield 500b, at least 80% of a height of the RF shield 500b, at least 90% of a height of the RF shield 500b, or more. In some embodiments, a lip 585b may contact a ledge of a pumping plate (such as pumping plate 410). FIG. 5C illustrates RF shield 500c that includes a lower annular member 550c and an upper annular member 575c that is seated atop lower annular member 550c. RF shield 500c may be similar to RF shield 500a, with an upper portion 565c of the lower annular member 550c extending higher to form a more pronounced vertical segment of the L-shape. For example, the upper portion 565c of the lower annular member 550b may extend along at least 50% of a height of the RF shield 500c, at least 60% of a height of the RF shield 500c, at least 70% of a height of the RF shield 500c, at least 80% of a height of the RF shield 500c, at least 90% of a height of the RF shield 500c, or more. A protrusion 580c extending downward from the upper annular member 575c may be longer to correspond to the longer upper portion 565c. FIG. 5D illustrates RF shield 500d that includes a lower annular member 550d and an upper annular member 575d that is seated atop lower annular member 550d. RF shield 500d may be similar to RF shield 500c, but with an upper portion 565d of the lower annular member 550d extending upward to form a lip 585d and upper surface 590d of the RF shield 500d. The upper annular member 575d may terminate prior to reaching an outer lateral surface of the RF shield 500d.

Figure 5E:
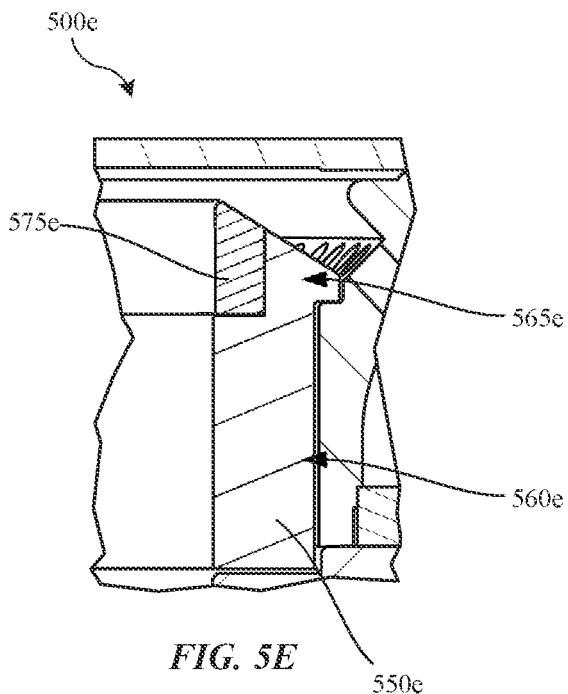
FIG. 5E shows a schematic cross-sectional view of an exemplary RF shield according to some embodiments of the present technology.
Figure 5F:
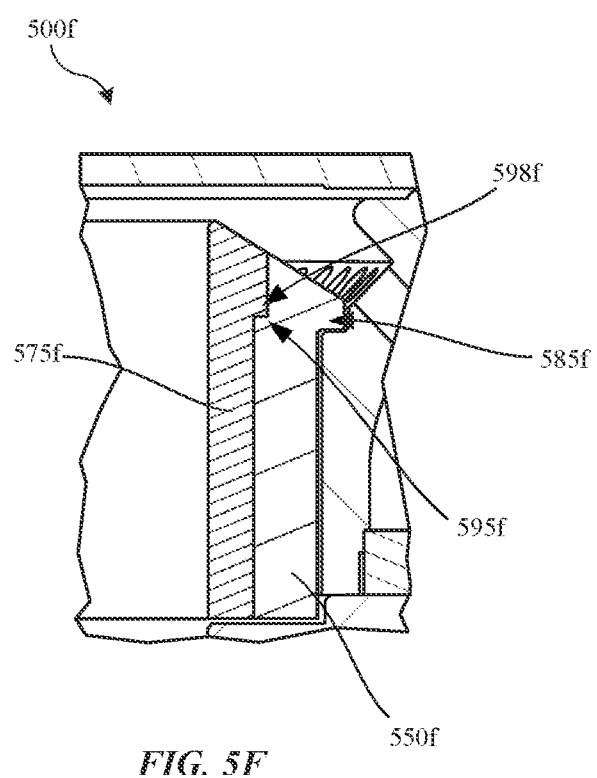
FIG. 5F shows a schematic cross-sectional view of an exemplary RF shield according to some embodiments of the present technology.

FIG. 5E illustrates RF shield 500e that includes a lower annular member 550e and an upper annular member 575e that is seated atop lower annular member 550e. RF shield 500e may be similar to RF shield 500d, but with the upper annular member 575e being shorter. For example, the upper annular member 575e may extend along no greater than 50% of a height of the RF shield 500e, no greater than 40% of a height of the RF shield 500e, no greater than 30% of a height of the RF shield 500e, no greater than 20% of a height of the RF shield 500e, no greater than 10% of a height of the RF shield 500e, or less. An upper portion 565e of the lower annular member 550e may extend upward from the lower portion 560e of the lower annular member 550e a greater height to correspond to the longer upper portion 565e. FIG. 5F that includes a lower annular member 550f and an upper annular member 575f that is positioned above lower annular member 550f. As illustrated, each annular member extends from a bottom surface of the RF shield 500f to an upper surface of the RF shield 500f. A top inner edge of the lower annular member 550f may define a ledge 595f while a top outer edge of the lower annular member 550f may define a lip 585f that may be seated atop a ledge of a pumping plate (such as pumping plate 410). A top outer end of the upper annular member 575f may define a lip 598f that may be positioned over ledge 595f.

Figure 6A:
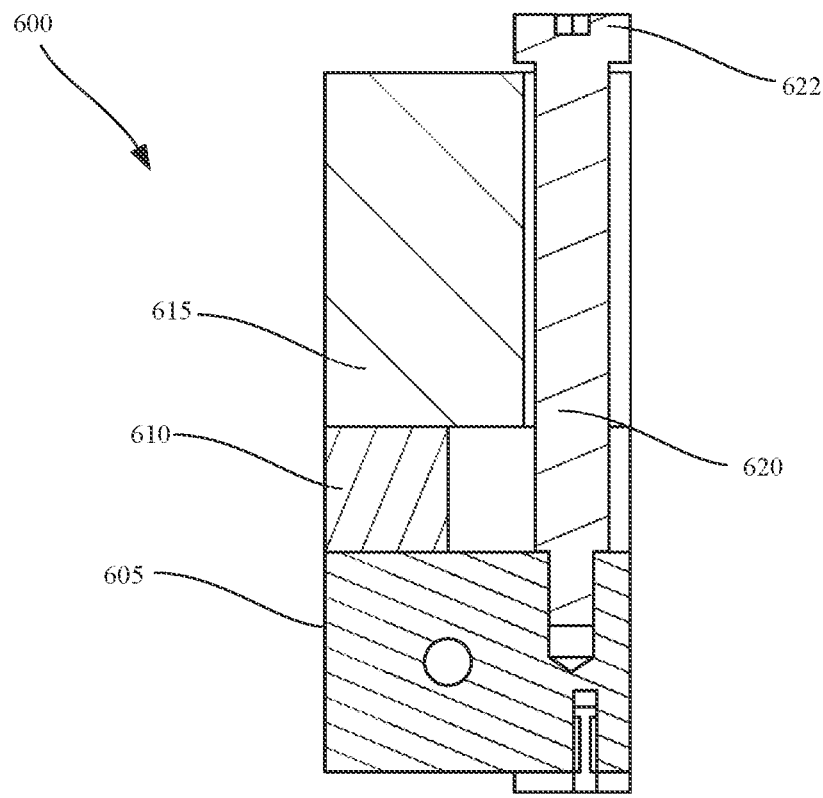
FIG. 6A shows a schematic partial cross-sectional view of an exemplary processing system according to some embodiments of the present technology.
Figure 6B:
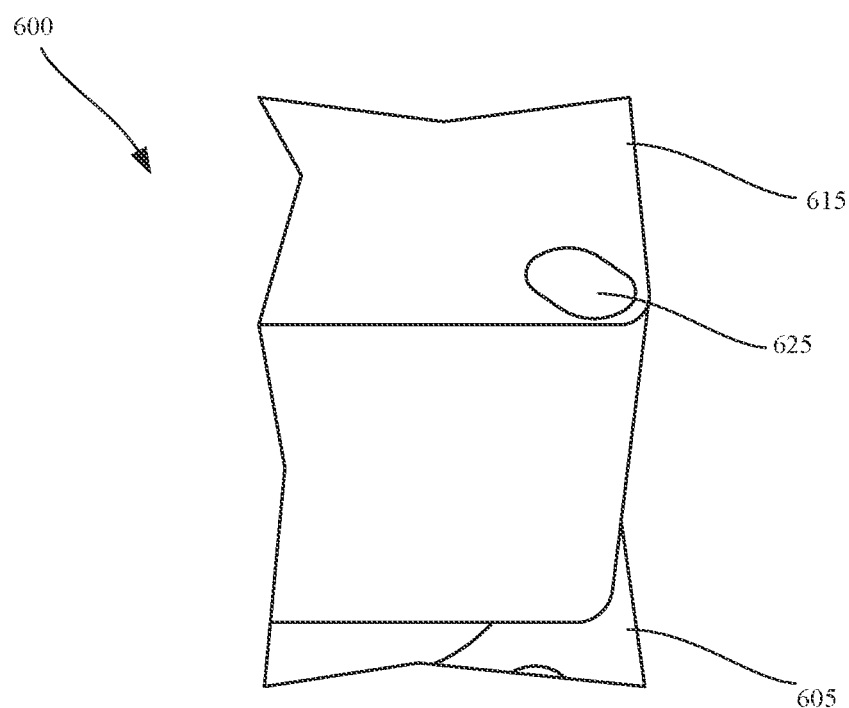
FIG. 6B shows a partial isometric view of the processing system of FIG. 6.

FIGS. 6A and 6B illustrate partial views of an exemplary substrate processing system 600 according to some embodiments of the present technology. FIG. 6 may illustrate further details relating to components in system 100, system 300, and/or system 400, such as for pumping liners 145, pumping plate 370, pumping plate 410, choke plate 147, choke plate 320, and/or choke plate 405. System 600 is understood to include any feature or aspect of system 100, system 300, and system 400 discussed previously in some embodiments. The system 400 may be used to perform semiconductor processing operations including deposition of hardmask materials as previously described, as well as other deposition, removal, and cleaning operations.

System 600 may include a lid plate 605 (such as lower lid plate 350), a thermal choke plate 610 (such as choke plates 147, 320, 405) seated atop the lid plate 605, and a pumping plate 615 (such as pumping liners/plates 145, 370, 410) seated atop the thermal choke plate 610. In some embodiments, one or more fasteners 620 may be used to help align secure the lid plate 605, the thermal choke plate 610, and the pumping plate 615. For example, apertures that are sized to receive the fasteners 620 may be defined through each component. In the illustrated embodiment, the aperture defined within the lid plate 605 is in the form of a threaded recess that may engage threads of the fastener 620 to secure the fastener 620 in place. In some embodiments, the length of the apertures and the length of the fasteners 620 may be selected such that a bottom surface of a head 622 of the fastener 620 is spaced apart from a top surface of the pumping plate 615 when the fastener 620 is fully tightened such that an air gap is provided between the bottom surface of the head 622 of the fastener 620 and the top surface of the pumping plate 615. Such an air gap may accommodate thermal expansion of the pumping plate 615 without leading to warpage the pumping plate 615. In some embodiments, a portion 625 of each aperture formed through the pumping plate 615 may have an elongate (rather than circular) cross-sectional shape as shown in FIG. 6B. For example, the portion 625 of each aperture may be stadium shaped in some embodiments. The elongate shape may help further accommodate thermal expansion of the fastener 620 and/or the pumping plate 615.

It will be appreciated that the RF shields described above are merely provided as examples and that numerous variations exist. Additionally, features of the various RF shields described herein may be combined with one another. In some embodiments, RF shields may include more than two pieces, which may further reduce the thermal gradients exhibited by each piece of the RF shield.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of +20% or +10%, +5%, or +0.1% from the specified value, as such variations are appropriate to in the context of the systems, devices, circuits, methods, and other implementations described herein. "Substantially" as used herein when referring to a measurable value such as an amount, a temporal duration, a physical attribute (such as frequency), and the like, also encompasses variations of +20% or +10%, +5%, or +0.1% from the specified value, as such variations are appropriate to in the context of the systems, devices, circuits, methods, and other implementations described herein.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A radio frequency shield, comprising:
   a lower annular member; and
   an upper annular member seated atop the lower annular member, wherein:
      the upper annular member defines a lip that protrudes radially outward from an outer surface of the upper annular member;
      a top surface of the upper annular member is sloped downward from an inner diameter to an outer diameter; and
      each of the lower annular member and the upper annular member comprises a dielectric material.

2. The radio frequency shield of claim 1, wherein:
   the lower annular member comprises a generally L-shaped cross-section; and a bottom surface of the upper annular member comprises a downward extending protrusion that is positioned above a ledge defined by a lower portion of the lower annular member.

3. The radio frequency shield of claim 1, wherein:

a top outer edge of the lower annular member is chamfered.

4. The radio frequency shield of claim 1, wherein:

the lower annular member comprises an annular protrusion extending upward from an inner edge of an upper surface of the lower annular member.

5. The radio frequency shield of claim 4, wherein:

a portion of a bottom surface of the upper annular member that is radially outward from the annular protrusion is spaced apart from an upper surface of the lower annular member by an air gap.

6. The radio frequency shield of claim 1, wherein:

a maximum thickness of the lower annular member is between 5 mm and 20 mm.

7. The radio frequency shield of claim 1, wherein:

the lower annular member comprises a lower portion and an upper portion that protrudes upward from the lower portion.

8. The radio frequency shield of claim 7, wherein:

the upper portion is disposed at an inner diameter of the lower annular member.

9. The radio frequency shield of claim 7, wherein:

the upper portion is disposed at an outer diameter of the lower annular member.

\* \* \* \* \*